(12) United States Patent
Wobben

(10) Patent No.: US 7,193,409 B2
(45) Date of Patent: Mar. 20, 2007

(54) MEASURING TRANSFORMER UTILIZING A REFERENCE CURRENT

(76) Inventor: Aloys Wobben, Argestrasse 19, Aurich (DE) 26607

( * ) Notice: Subject to any disclaimer, the term of this patent is extended or adjusted under 35 U.S.C. 154(b) by 0 days.

(21) Appl. No.: 11/364,515

(22) Filed: Feb. 27, 2006

(65) Prior Publication Data

US 2006/0145684 A1  Jul. 6, 2006

Related U.S. Application Data

(60) Division of application No. 10/801,179, filed on Mar. 15, 2004, now Pat. No. 7,057,384, which is a continuation-in-part of application No. PCT/EP02/09748, filed on Aug. 31, 2002.

(30) Foreign Application Priority Data

Sep. 14, 2001  (DE) ................ 101 45 415

(51) Int. Cl.
 *G01R 15/20* (2006.01)
(52) U.S. Cl. ................ 324/117 H
(58) Field of Classification Search ..... 324/117 R–117 H, 126–127, 251–252, 99, 130; 338/32 H
See application file for complete search history.

(56) References Cited

U.S. PATENT DOCUMENTS

| 4,639,665 A | 1/1987 | Gary ............ 324/117 H |
| 5,132,608 A | 7/1992 | Nishifuji et al. ........ 324/99 R |
| 5,146,156 A * | 9/1992 | Marcel ............ 324/127 |
| 5,177,428 A * | 1/1993 | Hirose et al. ........ 323/207 |
| 5,477,135 A | 12/1995 | Baker ............ 324/130 |
| 5,493,211 A | 2/1996 | Baker ............ 324/130 |

FOREIGN PATENT DOCUMENTS

| DE | 25 49 315 | 10/1976 |
| DE | 26 01 252 | 6/1977 |
| DE | 27 06 547 | 9/1977 |
| DE | 31 33 908 C2 | 7/1982 |

(Continued)

OTHER PUBLICATIONS

Ogasawara, S. et al., "A Digital Current Sensor for PWM Inverters," in *Proceedings of the Industry Applications Society Annual Meeting*, Oct. 4-9, 1992, Houston, TX, pp. 949-955.

*Primary Examiner*—Vinh P. Nguyen
(74) *Attorney, Agent, or Firm*—Seed IP Law Group PLLC

(57) ABSTRACT

A measuring transformer compares a current flowing through a conductor to a reference current. In one embodiment, the measuring transformer includes a magnetic circuit formed by a toroidal core, a conductor through which the current to be measured flows and which is enclosed by the toroidal core, a secondary winding arranged on the toroidal core, and a magnetic field measuring element which is arranged in a gap of the toroidal core and which is sensitive to the magnetic field in the gap. In order to be able to reliably detect even high-frequency deviations from the reference current, the measuring transformer includes a reference presetting unit for acting on the secondary winding with the reference current. According to one embodiment, the measuring transformer is used for measuring an output current of an inverter for a wind power installation.

15 Claims, 2 Drawing Sheets

FOREIGN PATENT DOCUMENTS

| | | |
|---|---|---|
| DE | 37 05 450 A1 | 9/1988 |
| DE | 39 05 060 C2 | 8/1990 |
| DE | 41 42 342 C2 | 6/1993 |
| DE | 42 30 939 C2 | 3/1994 |
| DE | 44 23 429 A1 | 1/1996 |
| DE | 196 42 472 A1 | 4/1998 |
| DE | 198 53 464 C1 | 4/2000 |
| EP | 0 157 054 A1 | 10/1985 |
| EP | 0 194 225 A1 | 9/1986 |
| EP | 0 133 695 B1 | 3/1988 |
| EP | 0 580 473 A1 | 1/1994 |
| EP | 0 692 098 B1 | 1/1996 |
| EP | 0 738 894 A2 | 10/1996 |
| EP | 0 783 110 A1 | 7/1997 |
| EP | 0 665 637 B1 | 8/2000 |

\* cited by examiner

US 7,193,409 B2

MEASURING TRANSFORMER UTILIZING A REFERENCE CURRENT

CROSS-REFERENCES TO RELATED APPLICATIONS

This application is a divisional of U.S. patent application Ser. No. 10/801,179, filed Mar. 15, 2004, now issued as U.S. Pat. No. 7,057,384, which is a continuation-in-part of International Application Serial No. PCT/EP02/09748, filed Aug. 31, 2002, which claims priority from German Application Serial No. 101 45 415.5, filed Sep. 14, 2001, all of which applications are incorporated herein by reference in their entireties.

BACKGROUND OF THE INVENTION

1. Field of the Invention

The invention concerns a measuring transformer for comparing a current flowing through a conductor to a reference current comprising a magnetic circuit formed by a toroidal core, a conductor through which the current flows and which is enclosed by the toroidal core, a secondary winding arranged on the toroidal core, and a magnetic field measuring element which is arranged in a gap of the toroidal core and which is sensitive to the magnetic field in the gap. The invention further concerns a control unit for controlling or regulating a current flowing through a conductor, an inverter, in particular for a wind power installation, as well as a wind power installation having such an inverter.

2. Description of the Related Art

A measuring transformer of the kind set forth in the opening part of this specification is known from EP 0 194 225. In the case of that measuring transformer the amplified output signal of a Hall element which serves as a magnetic flux measuring element feeds the secondary winding. The winding direction thereof is so selected that the magnetic field produced is in opposite relationship to the magnetic field surrounding the conductor through which the current flows. In that case the secondary winding is fed by the amplifier in such a way that it tries to make zero the magnetic field produced by the conductor. The current through the secondary winding is used as a measurement in respect of the current flowing in the conductor, that is to say the output signal of the secondary winding gives the absolute value of the instantaneous current flow.

A further measuring transformer of the kind set forth in the opening part of this specification is known from Elektronik Industrie 8-2001, pages 49 and 51. In that measuring transformer also, a coil is again wound around the toroidal core, and the current flowing through the conductor again induces a current in the coil. That induced current is superimposed with a possible deviation detected by the Hall element, and thus again gives an absolute value as a measurement in respect of the current flowing in the conductor. It will be noted however that with this measuring transformer also, the main component of the induced current again flows through the secondary winding. The combination of the Hall element and the amplifier detects the respective proportion of the current which flows in the conductor and which the secondary winding on the toroidal core cannot detect.

A measuring transformer of the kind set forth in the opening part of this specification is also further known from EP 0 580 473 A1. EP 0 157 054 A discloses a fault current protection switch in which two turns are arranged on a toroidal core. A comparator is provided for comparing the output voltage of a Hall element arranged in an intermediate space of the toroidal core to a reference voltage. The switch is then controlled by means of the output voltage from the comparator.

The article by Ogasawara et al 'A Digital Current Sensor for PWM inverters', Proceedings of the Industry Applications Society Annual Meeting, Houston, Oct. 4, 1992, New York, US, Vol 1, 4th Oct. 1992, pages 949–955, in FIG. 2, discloses a further measuring transformer for analog currents, which approximately corresponds to the measuring transformer known from EP 0 194 225.

In the case of the known measuring transformers the respective output signal is subjected to further processing in any manner as it gives the absolute value of the instantaneous current flow through the conductor. By way of a downstream-connected comparator, that value can be compared for example to a reference or target value in order to derive therefrom control signals, for example for an inverter, the current of which is delivered by way of the above-mentioned conductor. As that current can readily amount to some hundreds of amperes—instantaneous peak values perfectly well reach around 750 amperes—, a suitably high number of ampere-turns must be reached with the secondary winding. In that case, the lower the current flowing through the secondary winding is intended to be, the correspondingly higher the number of turns must correspondingly be.

That however is also the serious disadvantage of the known structures. An inductance also always forms a time constant and thus limits the possible ways of rapidly following fluctuations in the current flowing in the conductor. A further aggravating circumstance is that the inductance of the secondary winding itself, by virtue of its typically inductive behaviour, makes rapid signal changes impossible.

SUMMARY OF THE INVENTION

One object of the present invention is to provide a measuring transformer with respect with which even high-frequency deviations from a reference value can be reliably detected and which can be used in particular in relation to an inverter for a wind power installation.

In accordance with the invention that object is attained in that there is provided a reference presetting unit for acting on the secondary winding with a reference current which sets the current which is to flow in the conductor through which current flows.

Unlike the situation with the known structures, the secondary winding is not connected to the output of the magnetic flux measuring element or an amplifier connected thereto. Instead of that, a reference current is fed in. In accordance with the invention, the output of the magnetic flux measuring element or an amplifier connected thereto in a preferred embodiment, is available as the signal output. In the ideal situation the current flowing in the conductor corresponds to the reference current which is fed into the secondary winding so that the resulting magnetic flux in the toroidal core and the signal at the output of the magnetic flux measuring element are zero.

If the current in the conductor differs from the reference value, that results in a resulting magnetic flux in the toroidal core and a corresponding signal at the output of the magnetic flux measuring element. That signal is a measurement in respect of the deviation of the current in the conductor from the reference value of the current, flowing through the secondary winding. As there is no inductance in the output branch between the magnetic flux measuring element and the signal output, even high-frequency deviations from the reference value of the current can be reliably detected, possibly amplified and provided at the output. Accordingly, it is also possible to derive rapidly corresponding control or regulating signals for an inverter, for example of a wind power installation, from the output signal, in order to approximate the actual value to the reference value of the current as quickly as possible and in the best possible fashion.

Advantageous configurations of the measuring transformer according to the invention are set forth in the appendant claims. Preferably a Hall element is used as the magnetic flux measuring element. In addition the output signal of the magnetic flux measuring element is preferably amplified by an amplifier before it is made available at the signal output.

In order to obtain the absolute value of the current flowing in the conductor, the reference current can be superimposed with the output signal of the magnetic flux measuring element or the downstream-connected amplifier, which is preferably effected in a stage connected downstream of the signal output.

The invention also concerns a control unit as set forth in claim 6 for controlling or regulating a current flowing through a conductor with a measuring transformer according to the invention for measuring the current flowing through the conductor. Preferably, the measuring transformer according to the invention is used in relation to an inverter for a wind power installation for measuring the output current of the inverter. Accordingly the invention also concerns a wind power installation as set forth in claim 9.

BRIEF DESCRIPTION OF THE SEVERAL VIEWS OF THE DRAWING(S)

The invention is described in greater detail hereinafter with reference to the drawings in which.

DETAILED DESCRIPTION OF THE INVENTION

Figure 1:
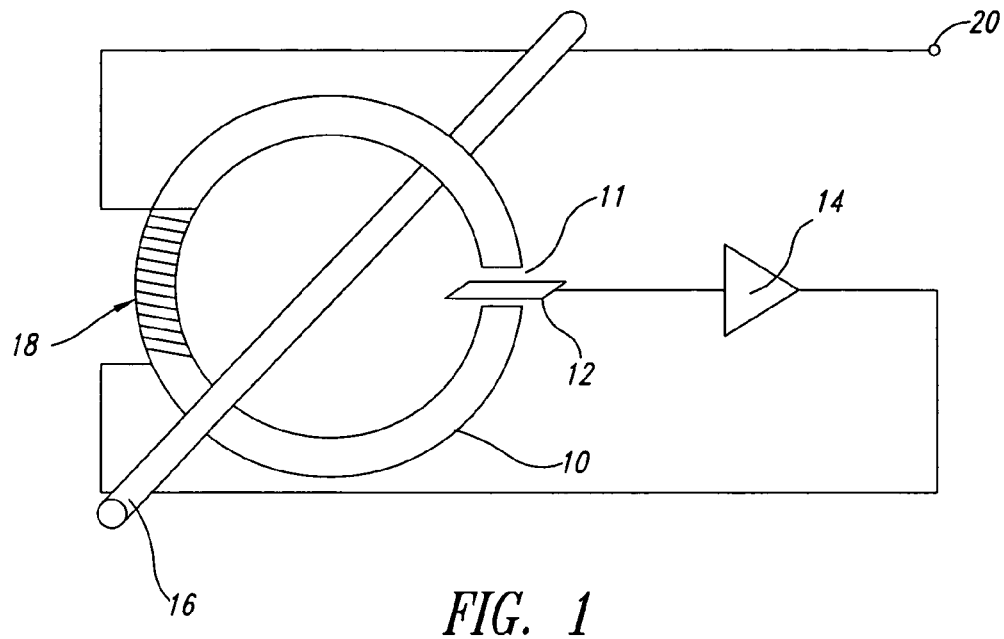
FIG. 1 is a diagrammatic view of a known measuring transformer.

FIG. 1 is a simplified view showing the principle used in relation to the measuring transformer known from EP 0 194 225. That known measuring transformer firstly has a toroidal core 10 of ferromagnetic material, through which extends a conductor 16 through which flows the current to be measured. A Hall element 12 is arranged in the air gap 11 of the toroidal core 10. The magnetic field produced by the current flow around the conductor 16 results in a magnetic flux in the toroidal core 10 and thus also through the Hall element 12. The output signal of the Hall element 12 is fed to an amplifier 14 whose output is connected to a secondary winding 18 which is wound around the toroidal core 10.

When now a current flows through the secondary winding 18 it also forms a magnetic field. In that respect the winding direction of the secondary winding 18 is so selected that the corresponding magnetic field is in the opposite direction to the magnetic field around the conductor 16. That provides that the two magnetic fields cancel each other out, that is to say there is no longer any magnetic flux in the toroidal core 10 and consequently the Hall element 12 no longer produces a signal when both magnetic fields are of equal magnitude.

According to the known measuring transformer as shown in FIG. 1 the secondary winding 18 is always supplied with a current which seeks to compensate for the magnetic field of the conductor 16 and thus forms a measurement in respect of the current flowing in the conductor 16. As the secondary winding 18 is known, the flowing current is a measurement in respect of the magnetic field produced by the conductor 16 and thus a measurement in respect of the current flowing in the conductor 16. Thus, it is possible to detect at the output 20 of the secondary winding 18 a signal which is a measurement in respect of the current flowing in the conductor 16.

That output signal at the output 20 can be subjected to further processing in any desired manner as it gives the absolute value of the instantaneous current flow. By way of a downstream-connected comparator (not shown) that value can be compared for example to a reference value in order to derive therefrom for example control signals 29 for an inverter, the current of which is delivered by way of the conductor 16.

As such a current can readily amount to several hundreds of amperes, it is necessary to achieve a correspondingly high number of ampere-turns with the secondary winding 18. In that case, the lower the current flowing through the secondary winding 18 is to be, the correspondingly higher must the number of turns be. That is also the serious disadvantage of this structure for an inductance also always forms a time constant and thus limits the possible ways of rapidly following high-frequency fluctuations in the current flowing in the conductor 16. Another aspect which increases the difficulty here is that the inductance of the secondary winding 18 itself, by virtue of its typically inductive behaviour, makes rapid signal changes impossible.

Figure 2:
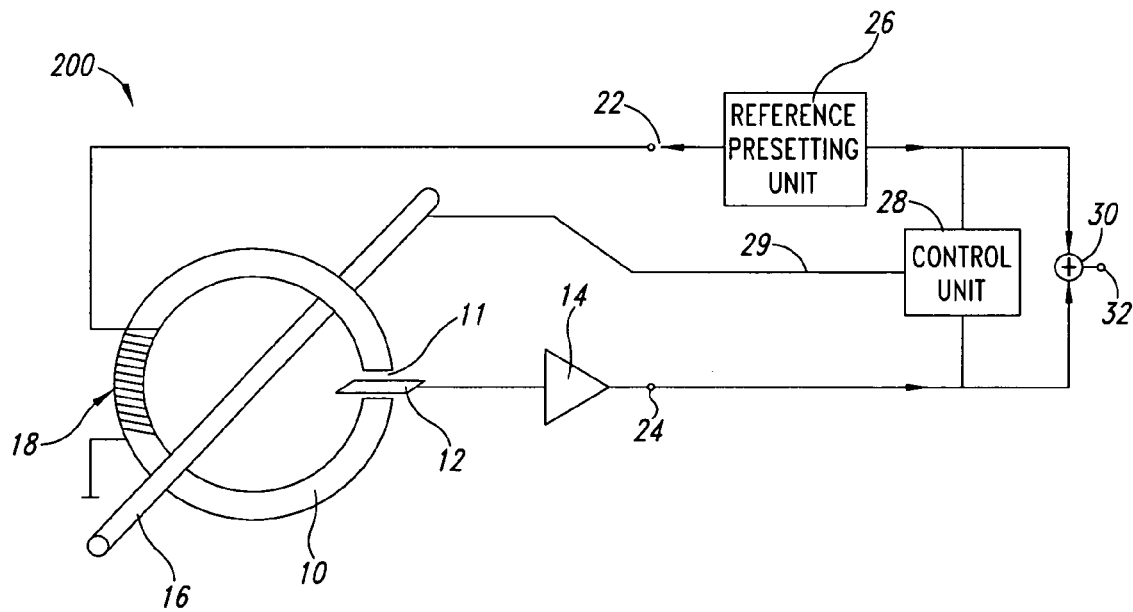
FIG. 2 is a diagrammatic view of a measuring transformer according to the invention.

An embodiment of a measuring transformer 200 according to the invention is diagrammatically shown in FIG. 2. It again has a toroidal core 10 comprising a ferromagnetic material with an air gap 11 in which a magnetic flux measuring element 12, for example once again a Hall element, is arranged. Connected on the output side of the Hall element 12 is an amplifier 14 for amplifying the electrical output signal of the Hall element 12. As in the known measuring transformer a conductor 16 extends through the annular core 10, through which the current to be measured flows.

As a departure from the known measuring transformer the secondary winding 18 is not connected to the output of the amplifier 14. Instead of that the secondary winding 18 has an input terminal 22 and is connected with its other end to ground. The output of the amplifier 14 is available as a signal output 24.

While therefore in the known measuring transformer the secondary winding 18 is always supplied with a current which seeks to compensate for the magnetic field of the conductor 16 and thus forms a measurement in respect of the current flowing in the conductor 16, in accordance with the invention the secondary winding 18 is acted upon by a predetermined reference current. That is applied to the input terminal 22 by a reference presetting unit 26. In the ideal case the current flowing in the conductor 16 corresponds to that reference current so that the resulting magnetic flux in the toroidal core 10 is equal to zero, the signal of the Hall element 12 is zero and thus there is also no signal at the output 24.

If the current in the conductor 16 deviates from the reference value, there is a resulting magnetic flux in the toroidal core 10 and a corresponding signal from the Hall element 12, which is passed amplified by way of the amplifier 14 to the output 24. That output signal is a measurement in respect of the deviation of the current in the conductor 16 from the reference value of the current, which flows through the secondary winding 18.

According to the invention as shown in FIG. 2 a predetermined reference current is supplied at terminal 22 to the secondary winding 18 by the reference presetting unit 26. The unit 26 can be a basic controlled current source which provides such a predetermined current. Many known circuits for this current source can be used and a person skilled in the art will know which kind of device from the many known to use for providing a predetermined reference current. If now the current flowing in the conductor 16 equals this predetermined reference current, the resulting magnetic flux in the core 10 is equal to zero and the signal of the whole element 12 is equal to zero so that there is no signal at the output 24. If, however, the current in the conductor 16 is different from the reference current, there is a resulting magnetic flux in the core 10, resulting in a signal of the whole element 12, which is after amplification provided at the output 24. This output signal reflects the deviation of the current in the conductor 16 from the reference current flowing through the winding 18. The terminal 24 is the output terminal providing the mentioned output signal.

Figure 3:
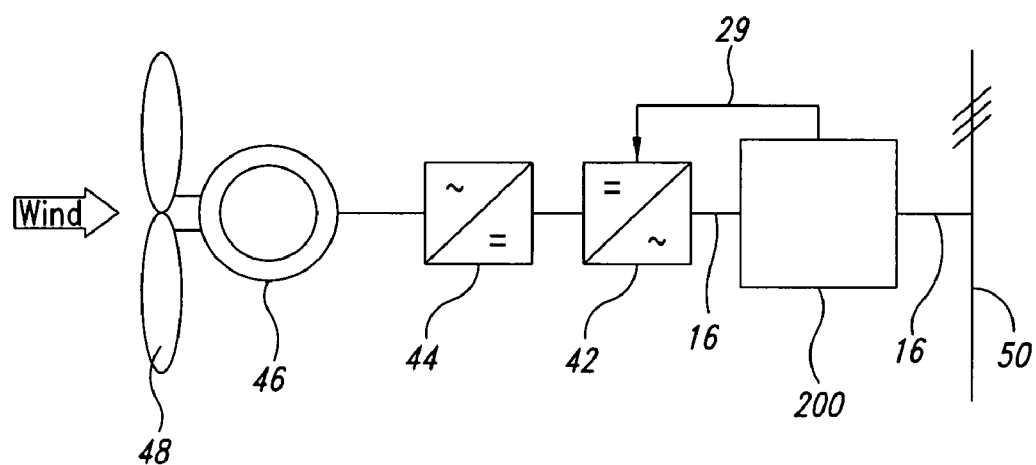
FIG. 3 is a diagrammatic view of a wind power installation.

There are many different uses of such a measuring transformer. FIG. 3 is a diagrammatic view of a wind power installation 40 comprising a measuring transformer 200, an inverter 42, a converter 44, and a wind power generator 46 driven by a wind powered rotor 48. The wind power installation 40 is coupled to an exemplary electric grid 50. For instance, it can be used to measure the output current of an inverter 42, i.e. the current flowing through the conductor 16. In one embodiment, the inverter 42 is a component of a wind power installation 40. The wind power installation 40 drives the inverter 42 and the output current of the inverter 42 flows through the conductor 16. The output signal at output 24 then immediately shows if there are fluctuations in the current in the conductor 16. By use of the control unit 28 to which said output signal 29 is provided the current flowing through the conductor 16 can be controlled to approximate the actual value to the reference value as quickly as possible. Again, it will be known to the skilled person how to implement the control unit 28 to achieve the stated control since it is well within the ordinary skill of the art. For instance, a microcontroller or a microcomputer could be used with basic commands as described herein. In other embodiments in which the inverter 42 is used for wind power installations 40, the inverter 42 may also include as a component the control unit 28, the reference presetting unit 26, or both the control unit 28 and the reference presetting unit 26.

When the measuring transformer according to the invention is used to measure the output current of an inverter 42, that is to say the current flowing through the conductor 16, the reference current is at a frequency of 50 Hz. That results in a quite slow change in the current in the secondary winding 18. In that respect therefore the inductance of the secondary winding 18 plays a subordinate part.

It will be noted that fluctuations in the current in the conductor 16 can certainly be of high frequency due to external influences such as network reactions. As in accordance with the invention however there is no inductance in the branch consisting of the Hall element 12, the amplifier 14 and the output 24, even high-frequency deviations from the reference current can be reliably detected, amplified and provided at the output 24. Accordingly it is also possible to derive rapidly corresponding control or regulating signals for an inverter (not shown) from the signal at the output 24 by means of a control unit 28 in order to approximate the actual value to the reference value as quickly as possible.

Unlike the situation with the known structure in which a comparator has to be connected downstream of the measuring transformer in order to permit a reference-actual comparison, this comparison in the structure according to the invention is already implemented in the measuring transformer. The toroidal core 10 can here together with the Hall element 12 be viewed as a comparator as the Hall element 12 only still supplies a difference signal between the reference and actual values.

It will be appreciated that it is readily possible for the difference signal at the output 24 of the circuit according to the invention either to be subjected to further processing in the form of an analog signal or for example converted by way of a Schmitt trigger into digital control signals 29 for the inverter 42.

A measurement for the absolute value of the current flowing in the conductor is obtained with the measuring transformer according to the invention if the reference signal is superimposed with the output signal of the amplifier 14. That superimposed signal however is not fed into the secondary winding 18. That superimposition will preferably be effected by summing in a stage connected downstream of the amplifier 14. In one embodiment of the invention, as illustrated in FIG. 2, a summing unit 30 is electrically coupled to the reference presetting unit 26 and the signal output 24. The summing unit 30 receives the predetermined reference current from reference presetting unit 26 and receives the output signal from signal output 24. The summing unit 30 superimposes the predetermined reference current with the output signal to generate an absolute value of the current flowing in the conductor 16 at a summing unit output 32.

The measuring transformer according to the invention is preferably used in a wind power installation 40 for measuring the output current of the inverter 42 (FIG. 3), in which respect preferably a separate measuring transformer is used for each phase of the inverter 42.

In different uses the output signal at output 24 can be used as analog signal for further processing or can be transformed into digital control signals 29 for control of an inverter 42.

In a further use the absolute value of the current flowing in the conductor 16 can be obtained if the reference current is superimposed with the output signal at output 24, for instance by use of the summing unit 30.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for comparing current flowing through a conductor to a reference current, the method comprising:

generating a first magnetic flux in a toroidal core by passing the current through the conductor enclosed by a toroidal core, the toroidal core having an air gap;

generating a second magnetic flux in the toroidal core by passing the reference current through a secondary winding, the secondary winding arranged on the toroidal core;

detecting a third magnetic flux in the gap of the toroidal core, the third magnetic flux being a combination of the first magnetic flux and second magnetic flux and proportional to the difference between the current flowing through the conductor and the reference current; and generating a difference signal based upon the third magnetic flux.

2. The method of claim 1, further comprising:

amplifying the difference signal.

3. The method of claim 1, further comprising;

superimposing the difference signal with the reference current to obtain an absolute value of the current flowing through the conductor.

4. The method of claim 1, further comprising:

comparing the difference signal to the reference current to generate a control signal for regulating the current flowing through the conductor.

5. The method of claim 4, wherein the control signal regulates the current flowing through the conductor by modifying the current flowing through the conductor to approximate the reference current.

6. The method of claim 1, wherein the secondary winding is arranged on at least a portion of the toroidal core.

7. The method of claim 1, further comprising:

driving a wind power installation to generate the current from an inverter, wherein the current is an inverter current.

8. A system that compares an inverter current to a reference current, comprising:

an inverter for generating the inverter current; and a measuring transformer for comparing the inverter current to the reference current, the measuring transformer comprising:

a magnetic circuit formed by a toroidal core;

a conductor coupled to the inverter through which the inverter current flows and which is enclosed by a toroidal core;

a secondary winding arranged on the toroidal core;

a magnetic flux measuring element which is arranged in a gap of the toroidal core and which is sensitive to a magnetic field in the gap;

a reference presetting unit for providing on the secondary winding the reference current, wherein the magnetic flux measuring element delivers a difference signal representative of a difference between the reference current and the inverter current flowing through the conductor.

9. The system of claim 8, wherein the magnetic flux measuring element is positioned in the at least one air gap for generating an output signal based upon a magnetic flux detected in the at least one air gap, the difference signal representative of the deviation of the inverter current from the reference current.

10. The system of claim 9, further comprising:

a control unit electrically coupled to the magnetic flux measuring element and the conductor for generating a control signal based upon the difference signal to regulate the inverter current.

11. The system of claim 10, wherein the control signal regulates the inverter current by modifying the inverter current to approximate the reference current.

12. The system of claim 9, further comprising:

a reference presetting unit coupled to the secondary winding, wherein the reference presetting unit generates the reference current.

13. The system of claim 12, further comprising:

a summing unit electrically coupled to the reference presetting unit and the magnetic flux measuring element for superimposing the difference signal with the reference current to generate an absolute value of the inverter current.

14. The system of claim 12, further comprising:

the toroidal core enclosing the conductor, the toroidal core having at least one air gap and the secondary winding in which a reference current flows, the secondary winding arranged on at least a portion of the toroidal core.

15. The system of claim 8, further comprising:

a wind power generator wherein the inverter and measuring transformer reside.

* * * * *